(12) United States Patent
Choi et al.

(10) Patent No.: US 7,101,442 B2
(45) Date of Patent: Sep. 5, 2006

(54) REACTION APPARATUS

(75) Inventors: Jin-hyuk Choi, Suwon (KR);
Do-young Kam, Suwon (KR);
Jung-wook Kim, Seongnam (KR);
Suk-chan Lee, Suwon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 84 days.

(21) Appl. No.: 10/802,926

(22) Filed: Mar. 18, 2004

(65) Prior Publication Data

US 2004/0258584 A1    Dec. 23, 2004

(30) Foreign Application Priority Data

Jun. 19, 2003   (KR) .................... 10-2003-0039822

(51) Int. Cl.
*B65D 51/04*  (2006.01)
*F16J 13/16*  (2006.01)
*H01L 21/00*  (2006.01)
*C23C 14/00*  (2006.01)

(52) U.S. Cl. .................. 118/733; 118/50; 220/315; 220/810; 16/235; 16/239

(58) Field of Classification Search .................. None
See application file for complete search history.

(56) References Cited

U.S. PATENT DOCUMENTS

| | | | | | |
|---|---|---|---|---|---|
| 3,195,873 | A | * | 7/1965 | Philbrick, Jr. | ................ 266/211 |
| 3,269,587 | A | * | 8/1966 | Svenson | .................... 220/582 |
| 4,169,538 | A | * | 10/1979 | Bird et al. | .................... 220/810 |
| 4,788,999 | A | * | 12/1988 | Dalpane | .................... 220/315 |
| 4,853,985 | A | * | 8/1989 | Perry | ......................... 220/817 |
| 5,205,532 | A | * | 4/1993 | Naehring | ...................... 251/85 |
| 5,400,442 | A | * | 3/1995 | Pendlebury | ................. 4/246.2 |
| 5,731,678 | A | * | 3/1998 | Zila et al. | ............... 318/568.11 |
| 5,794,277 | A | * | 8/1998 | Jones | ............................. 4/236 |
| 6,050,446 | A | | 4/2000 | Lei et al. | |
| 6,067,667 | A | * | 5/2000 | Suzuki | ........................ 4/246.1 |
| 6,237,985 | B1 | * | 5/2001 | O'Brian | ........................ 296/98 |
| 6,336,395 | B1 | | 1/2002 | Tiszai | |
| 6,406,209 | B1 | * | 6/2002 | Liu et al. | ....................... 403/13 |
| 6,517,634 | B1 | * | 2/2003 | Pang et al. | .................. 118/715 |
| 6,776,848 | B1 | * | 8/2004 | Rosenstein et al. | ......... 118/726 |
| 2003/0010451 | A1 | | 1/2003 | Tzu et al. | |

FOREIGN PATENT DOCUMENTS

| | | | |
|---|---|---|---|
| JP | 11-101345 A | | 4/1999 |
| JP | 11-159696 A | | 6/1999 |

OTHER PUBLICATIONS

Copy of Korean Office Action.

\* cited by examiner

*Primary Examiner*—Marlon T. Fletcher
*Assistant Examiner*—Eduardo Colon Santana
(74) *Attorney, Agent, or Firm*—Staas & Halsey LLP

(57) ABSTRACT

A reaction apparatus including: a main body having a reaction chamber with an upper opening thereof, a lid hinge, and a lid combined to the lid hinge, rotationally opening and closing the upper opening; a lifting member having a first end part separated from a rotation axis of the lid and rotatably combined with the lid, and a second end part rotatably combined to the main body, that moves in opening and closing directions; and a driver activating the lifting member. With this configuration, the present invention provides a reaction apparatus, with a lid that is opened and closed readily, and in which the lid parallelly contacts a sealing member, and thereby creating a vacuum in the reaction chamber with ease.

41 Claims, 14 Drawing Sheets

REACTION APPARATUS

CROSS-REFERENCE TO RELATED APPLICATIONS

This application claims the benefit of Korean Patent Application No. 2003-39822, filed Jun. 19, 2003, in the Korean Intellectual Property Office, the disclosure of which is incorporated herein by reference.

BACKGROUND OF THE INVENTION

1. Field of the Invention

The present invention relates to a reaction apparatus, and more particularly, a reaction apparatus to open and close a lid, and parallelly contact a sealing member, thereby forming a vacuum condition with ease.

2. Description of the Related Art

In a reaction apparatus, a semiconductor manufacturing process is generally performed in a vacuum condition. Hereinafter, the reaction apparatus used in the vacuum condition will be described.

FIG. 1 illustrates a conventional reaction apparatus. As shown therein, the conventional reaction apparatus comprises a main body 1 with a reaction chamber (not shown) having an opening part (not shown) in an upper part thereof; a lid 2 which rotationaly opens and closes the upper opening using a lid hinge 3; a gas spring 5 having a first end side separately placed from a center of rotation of the lid 2, and a second end side combined to the lid 2; and a handle 4 provided at an end of the lid 2 to aid opening and closing of the lid 2.

A process of opening and closing in the conventional reaction apparatus is accomplished as follows. When the lid 2 is opening, the vacuum condition is released, and the user gives a predetermined amount of force to the handle 4 of the lid 2 toward an opening direction of the lid 2, then the lid 2 is rotationally opened centering on a shaft line of the lid hinge 3 by a repulsive force generated from the gas spring 5.

When closing the lid 2, the user gives a predetermined force to the handle 4, exceeding the repulsive force from the gas spring 5, in a closing direction, to close the lid 2. Then, air in the reaction chamber is discharged by a vacuum pump (not shown). At this time, if the user further pushes the handle 4 in the closing direction, the vacuum is formed in the reaction chamber, thereby closing the lid 2 and creating an airtight seal.

But the user has to open and close the lid 2 by himself/herself, and he/she is required to generate a force to overcome the repulsive force of the gas spring 5. Therefore, it may be difficult for one person to open and close the lid 2 by himself/herself. Also, if the user wants to form the vacuum condition in the reaction chamber with the lid 2 being closed, the user has to continuously apply force to the lid 2 in the closing direction, to exceed a repulsive force generated by a sealing member (not shown) disposed in the main body 1.

SUMMARY OF THE INVENTION

Accordingly, it is an aspect of the present invention to solve the above and/or other problems of the conventional reaction apparatus, by providing a reaction apparatus whose lid is opened and closed readily, and wherein the lid parallelly contacts to a sealing member, thereby easing creation of a vacuum.

Additional aspects and advantages of the invention will be set forth in part in the description which follows and, in part, will be obvious from the description, or may be learned by practice of the invention.

The forgoing and/or other aspects of the present invention are achieved by providing a reaction apparatus having: a main body having a reaction chamber with an upper opening thereof, a lid hinge, and a lid combined to the lid hinge rotationally opening and closing the upper opening, a lifting member having a first end part separated from a rotation axis of the lid, and rotatably combined with the lid, and a second end part rotatably combined to the main body, that moves in opening and closing directions; and a driver activating the lifting member.

According to an aspect of the invention, the reaction chamber creates a vacuum condition when the lid is closed.

According to an aspect of the invention, the driver comprises a driving motor, a location sensor limiting the movement of the lifting member, and a controller controlling the driving motor with a signal transmitted from the location sensor.

According to an aspect of the invention, the lifting member is provided in a pair at opposite sides of the main body.

According to an aspect of the invention, the lid hinge comprises: a hinge bracket combined to an end part of the main body; a main hinge rotatably combined to the hinge bracket; a main hinge shaft rotatably combining the hinge bracket with the main hinge; a auxiliary hinge rotatably combined to the main hinge at an end part of the lid, rotatable through a predetermined range; and a auxiliary hinge shaft rotatably combining the main hinge with the auxiliary hinge.

According to an aspect of the invention, the main hinge is provided with a main hinge hole penetrated along a direction of a centerline on which the lid rotates, and a first auxiliary hinge hole penetrated to accommodate the auxiliary hinge shaft in parallel with the main hinge hole.

According to an aspect of the invention, the auxiliary hinge is provided with a second hinge hole provided along the first hinge hole to accommodate the auxiliary hinge shaft together with the main hinge.

According to an aspect of the invention, the auxiliary hinge and the main hinge are engaged to each other with a predetermined distance therebetween so that the lid rotates within the predetermined range.

According to an aspect of the invention, the lid hinge is plurally provided, and respectively combined to opposite sides of the end part of the main body.

According to an aspect of the invention, the main hinge shaft and the hinge bracket are integrally formed.

According to an aspect of the invention, the auxiliary hinge shaft is integrally formed with one of the main hinge and the auxiliary hinge, and the auxiliary hinge shaft is rotatably combined to the remaining one of the main hinge and the auxiliary hinge.

According to an aspect of the invention, the reaction apparatus further comprises a movable hinge rotatably combining the lifting member to the lid so that the lifting member rotates relative to the lid.

According to an aspect of the invention, the movable hinge comprises a movable hinge accommodating part combined to the lid, having a movable hinge hole, which is provided, and a movable hinge shaft accommodated in the movable hinge hole, combined with the first end of the lifting member.

According to an aspect of the invention, the movable hinge hole is elongated to allow the movable hinge shaft to move slidingly therein.

According to an aspect of the invention, the movable hinge shaft is integrally formed with the first end of the lifting member.

BRIEF DESCRIPTION OF THE DRAWINGS

The above and/or other aspects and advantages of the present invention will become apparent and more readily appreciated from the following description of the embodiments, taken in conjunction with the accompanying drawings, of which.

DETAILED DESCRIPTION OF THE PREFERRED EMBODIMENTS

Figure 1:
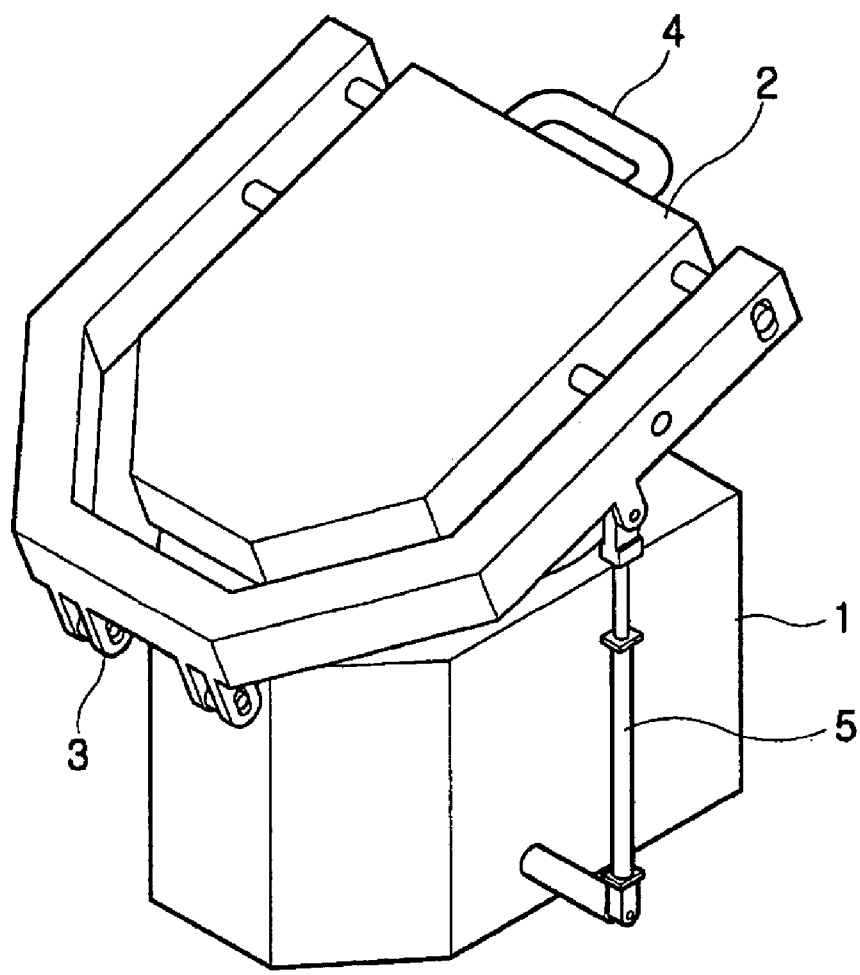
FIG. 1 is a perspective view of a conventional reaction apparatus.

Reference will now be made in detail to embodiments of the present invention, examples of which are illustrated in the accompanying drawings, wherein like reference numerals refer to like elements throughout. The embodiments are described below to explain the present invention by referring to the figures.

Figure 2:
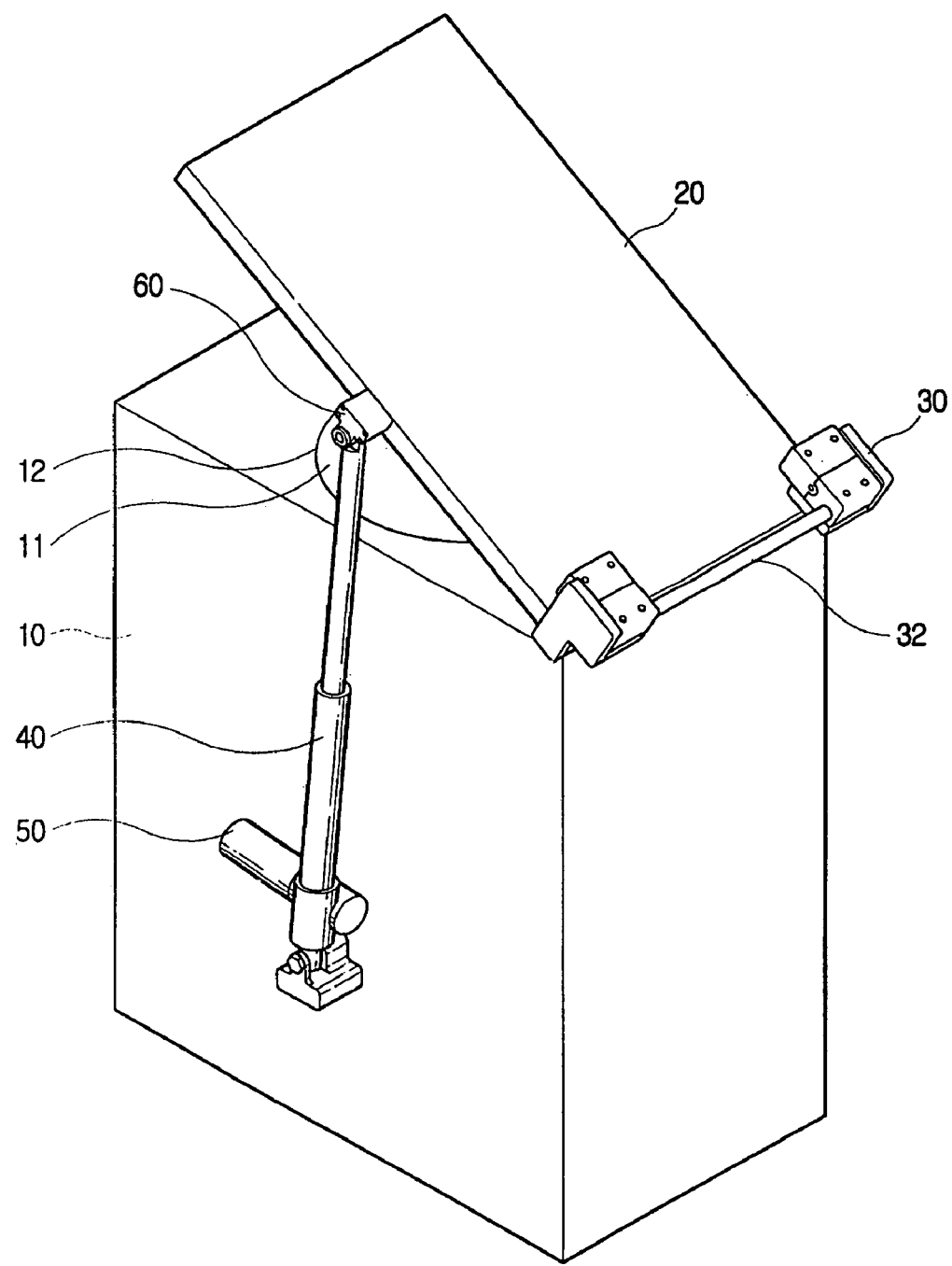
FIG. 2 is a perspective view of a reaction apparatus according to an embodiment of the present invention.

FIG. 2 is a combined perspective view of a reaction apparatus according to an embodiment of the present invention. As shown therein, the reaction apparatus comprises a main body 10 with a reaction chamber 11; a lid 20 opening and closing an upper opening of the reaction chamber 11; a lid hinge 30 supporting the lid 20 to rotationally open and close relative to the main body 10; a lifting member 40 having opposite end sides respectively combined to the main body 10 and the lid 20 to rotationally open and close the lid; and a driver 50 moving the lifting member 40 up and down.

The main body 10 comprises: the reaction chamber 11, which has an upper opening and in which a reaction process is accomplished; and a sealing member 12 provided around the upper opening of the reaction chamber 11, sealing the reaction chamber 11 by contacting the lid 20 when the lid 20 is closed.

Figure 3:
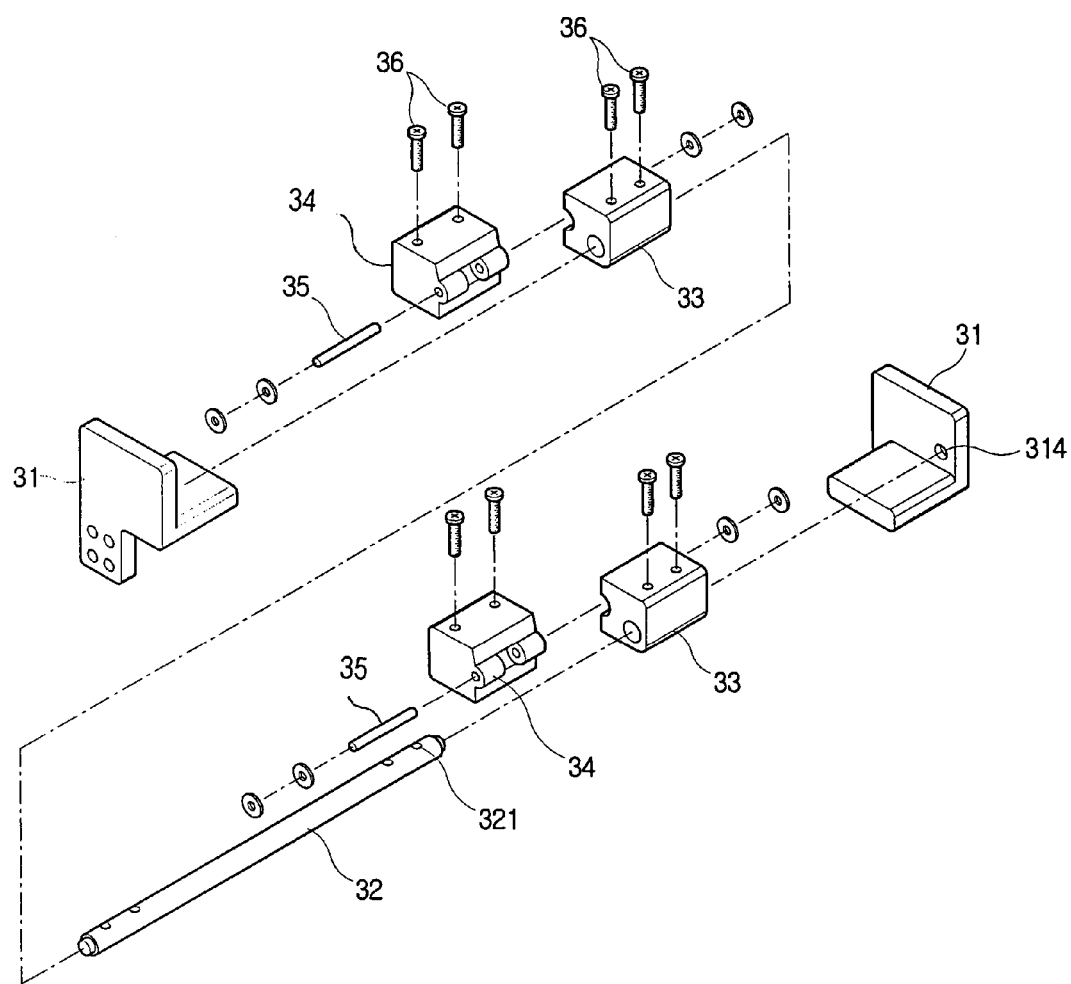
FIG. 3 is an exploded perspective view of a lid hinge of the reaction apparatus of FIG. 2.

As shown in FIG. 3, the lid hinge 30 comprises a hinge bracket 31 combined to the main body 10; a main hinge 33 rotatably combined to the hinge bracket 31; a main hinge shaft 32 rotatably combining the main hinge 33 with the hinge bracket 31; an auxiliary hinge 34, combined with the main hinge 33 and attached to an end side of the lid 20; and an auxiliary hinge shaft 35 rotatably combining the main hinge 33 with the auxiliary hinge 34.

The hinge bracket 31, the main hinge 33, and the auxiliary hinge 34 are provided in pairs, and disposed on the end side of the main body, respectively, opposite to each other.

The main hinge shaft 32 is rotatably combined to the hinge brackets 31 at ends thereof, and has combining holes 321 positioned adjacent to the ends of the main hinge shaft 32 to combine the main hinge shaft 32 with the main hinge 33.

Figure 4:
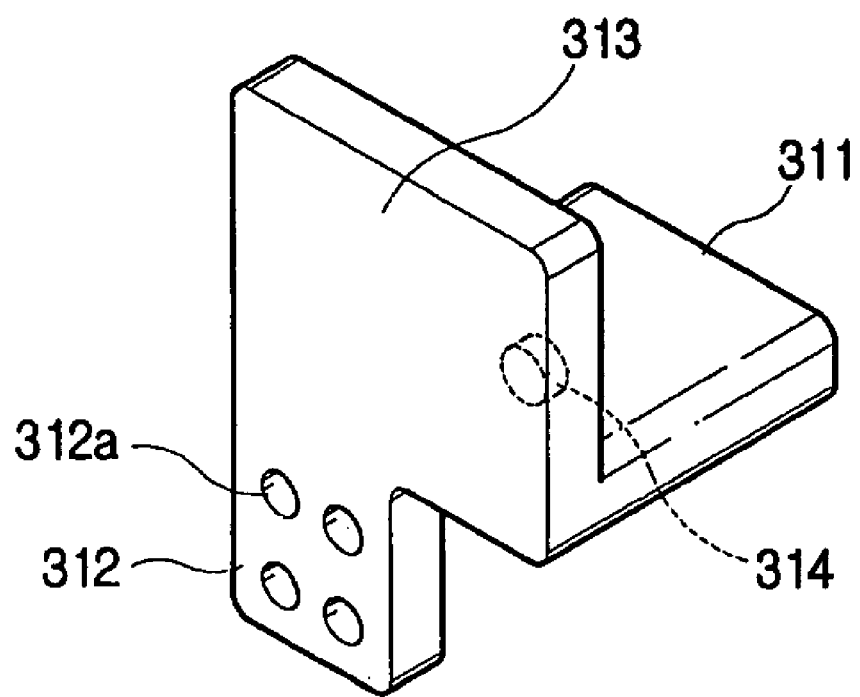
FIG. 4 is an enlarged perspective view of a hinge bracket of FIG. 3.

FIG. 4 is a perspective view of the hinge bracket 31 of the lid hinge 30. As shown therein, the hinge bracket 31 comprises: a main body combiner 312 combined to the main body 10; a holding part 311 extended from the main body combiner 312 along a line of the main hinge shaft 32, to hold the main hinge 33 and the auxiliary hinge 34; and a supporting part 313 perpendicularly extending from the holding part 311, and having a combining groove 314 accommodating an end part of the main hinge shaft 32.

The main body combiner 312 of the hinge bracket 31 has a plurality of combining holes 312a to couple the hinge bracket 31 to an end part of the main body 10. The holding part 311 is provided in a planar shape, on which bottom sides of the main hinge part 33 and the auxiliary hinge part 34 contact each other.

Figure 5:
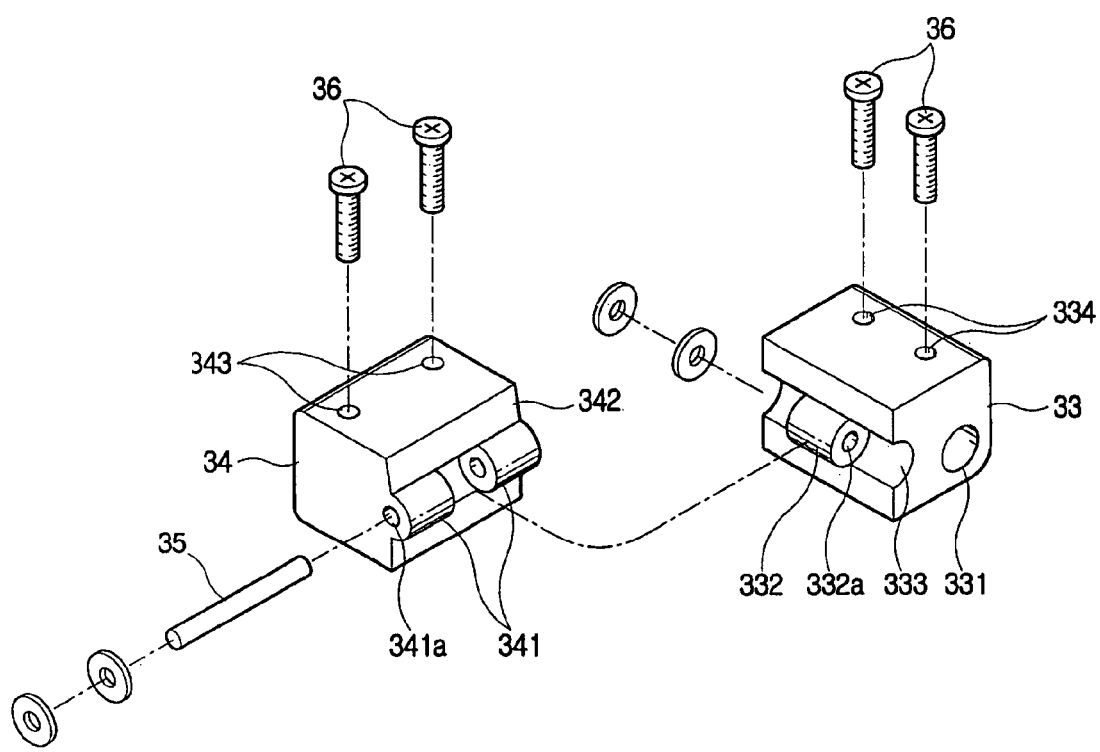
FIG. 5 is an exploded perspective view of a main hinge and an auxiliary hinge of FIG. 3.

FIG. 5 is an exploded perspective view of the lid hinge 30. As shown therein, the main hinge 33 is of a hexahedron shape, and a main hinge hole 331 is provided along the line of the main hinge shaft 32 to accommodate the main hinge shaft 32. Also, a first protrusion 332 is provided on a side where the main hinge 33 meets the auxiliary hinge 34, and the first protrusion 332 has a first auxiliary hinge hole 332a disposed approximately parallel with the main hinge hole 331.

On the side where the first protrusion 332 is provided, a concave part 333 is also provided to accommodate a second protrusion 341 (to be described later) of the auxiliary hinge 34. On a top side of the main hinge 33, a combining hole 334 penetrates from the top side of the main hinge 33 to the main hinge hole 331, so that a combiner 36 can pass therethrough, to secure the main hinge shaft 32 in the main hinge hole 331. Also, a corner adjacent to a bottom side and a rear side of the main hinge 33 is rounded to avoid an interference of the holding part 311 with the hinge bracket 31, while the lid 20 is rotating.

Like the main hinge 33, the auxiliary hinge 34 is also of a hexahedron shape, and has a plurality of second protrusions 341 provided on a side where the auxiliary hinge 34 meets the main hinge 33. The second protrusion 341 has a second auxiliary hinge hole 341a; an inclined part 342 inclined upward at a predetermined angle centering on the auxiliary hinge shaft 35, provided on the side where the auxiliary hinge 34 meets the main hinge 33; a combining hole 343; and at least one combiner 36, to combine the auxiliary hinge 343 with the lid 20.

The auxiliary hinge shaft 35 rotatably connects the main hinge 33 with the auxiliary hinge 34. The first protrusion 332 of the main hinge 33 is inserted between the plurality of the second protrusions 341, and the auxiliary hinge shaft 35 is inserted into the first auxiliary hinge hole 332a of the first protrusions 332 and the second auxiliary hinge hole 341a of the second protrusion 341, thereby rotatably combining the main hinge 33 and the auxiliary hinge 34. Due to the inclined part 342, the auxiliary hinge 34 rotates relative to the main hinge 33 within a predetermined range.

Figure 6:
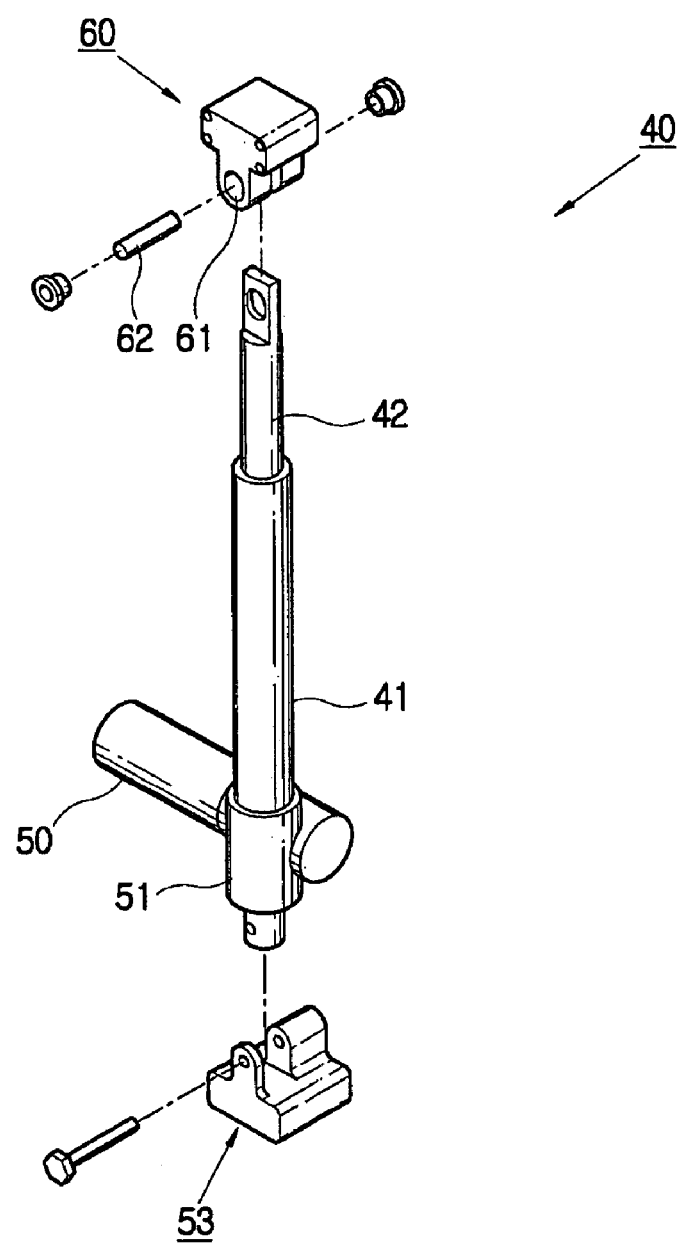
FIG. 6 is an exploded perspective view of a lifting member, a movable hinge, and a driver of FIG. 2.

FIG. 6 illustrates the lifting member 40, the driver 50, and a movable hinge 60. As shown therein, the lifting member 40 includes an inner member 42 and an outer member 41. The inner member 42 is accommodated in the outer member 41, and is driven by the driver 50 to extend from, and contract into the outer member 41, to respectively open and close the lid 20.

The movable hinge 60 is provided with a movable hinge hole 61 along a direction of the main hinge shaft line of the main body 10, to which a top end of the inner member 42 of the lifting member 40 is rotatably combined. The movable hinge 60 further comprises a movable hinge shaft 62 inserted in the movable hinge hole 61, rotatably connecting the movable hinge 60 to the top end of the lifting member 40. The movable hinge shaft 62 slides in the movable hinge hole 61.

Figure 14:
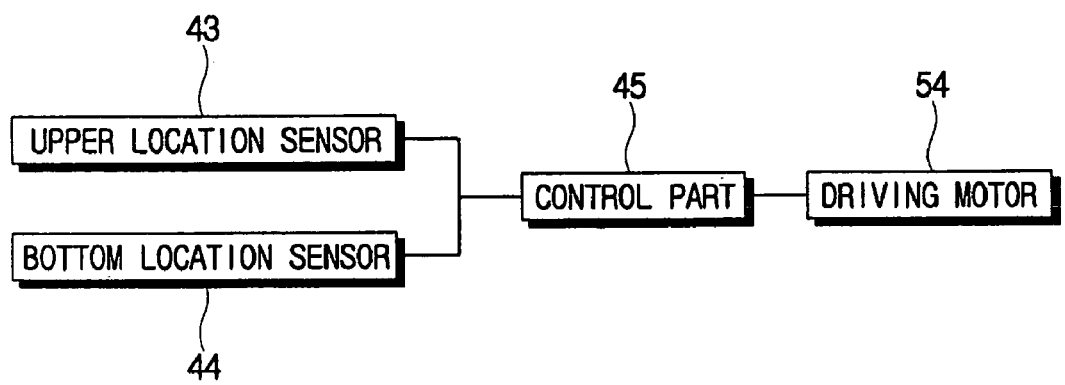
FIG. 14 is a block diagram illustrating an operation of the driver of FIG. 2.

The driver 50 includes a driving motor 54 (see FIG. 14), and a motion converter 51 disposed between the driving motor 54 and the lifting member 40, converting a rotational movement of the driving motor into a linear movement of the lifting member 40. According to one aspect, a bevel or worm gear train is used for the motion converter. The driver 50 also includes location sensors 43 and 44, and a controller 45 controlling the driving motor 54, by receiving location information of the inner member 42 of the lifting member 40, from the location sensors 43 and 44 (refer to FIG. 14).

In a bottom part of the outer member 41 of the lifting member 40, a combiner 53 is provided to rotatably combine the lifting member 40 and the main body 10.

According to one aspect, a pair of lifting members 40 are positioned on opposing sides of the main body 10.

Figure 7:
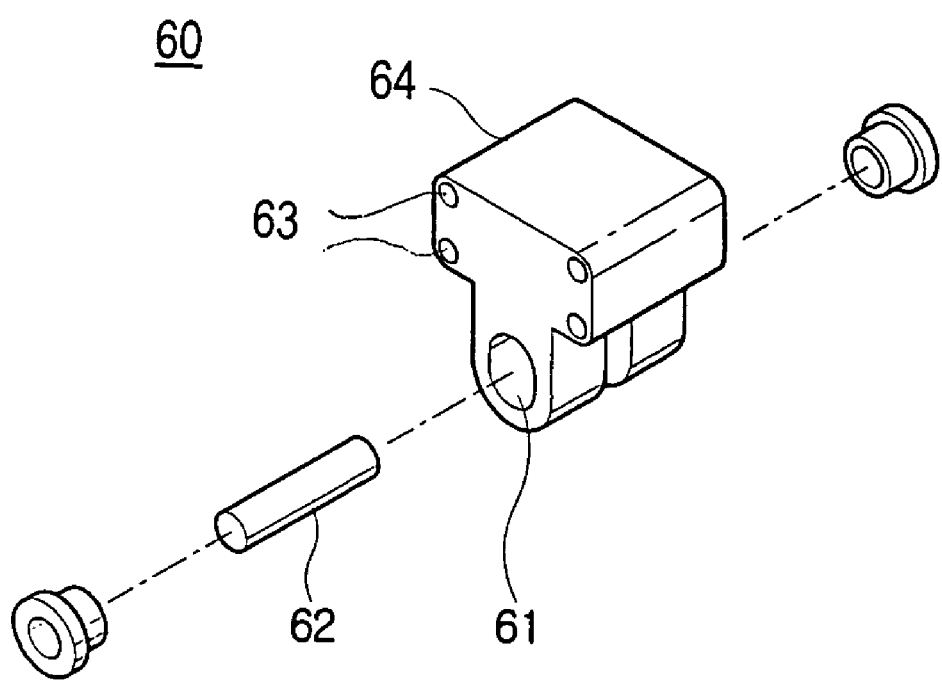
FIG. 7 is an enlarged perspective view of the movable hinge of FIG. 6.

FIG. 7 is an enlarged view of the movable hinge 60. The movable hinge 60 comprises a movable hinge accommodating part 64 having the movable hinge hole 61, and further comprises a combining hole 63 to combine the movable hinge 60 with the lid 20.

According to one aspect, the movable hinge hole 61 is elongated toward an expanding direction and a contracting direction of the lifting member 40. Thus, the movable hinge shaft 62 inserted in the movable hinge hole 61 slides in the expanding direction and the contracting direction in the elongated movable hinge hole 61.

With this configuration, the reaction apparatus according to the present invention operates as follows.

Figure 8:
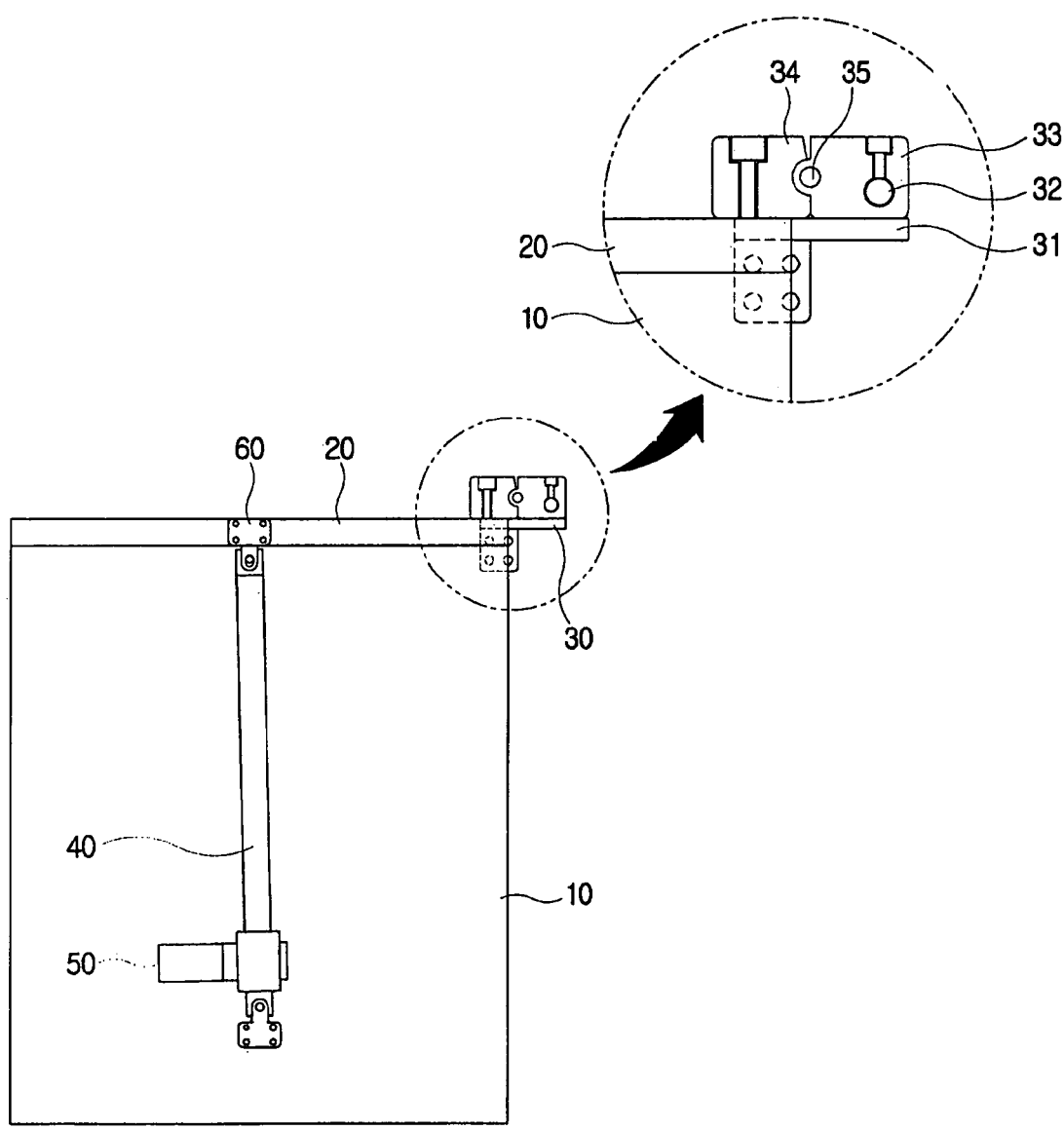
FIG. 8 schematically illustrates a lid of the reaction apparatus of FIG. 2, in a closed state.

FIG. 8 illustrates the lid 20 of the reaction apparatus in a closed state. As shown therein, when the lid 20 is closed, the lifting member 40 has descended toward the closing direction, and simultaneously, the opposite sides of the lifting member 40 have rotated relative to the main body 10 and the lid 20.

In a process of closing the lid 20, the opened lid 20 is to be closed rotating on the main hinge shaft 32 of the main hinge part 30 as the lifting member 40 descends toward the closing direction. The closed lid 20 contacts the sealing member 12 disposed around the upper opening of the reaction chamber 11 of the main body 10, and the main hinge 33 is seated on the holding part 311 of the hinge bracket 31. Subsequently, the vacuum condition is created in the reaction chamber 11, reducing a pressure inside of the reaction chamber 11. Consequently the lid 20 rotates further in the closing direction of the lid 20. Here, the auxiliary hinge 34 rotates relative to the main hinge 33 centering on the auxiliary hinge shaft 35 by a predetermined amount, causing the lid 20 to be completely closed, and overcoming the repulsive force of the sealing member 12. Thus, the upper part of the auxiliary hinge 34 is separated from the main hinge 33 by a predetermined amount when the lid 20 is completely closed.

Figure 9:
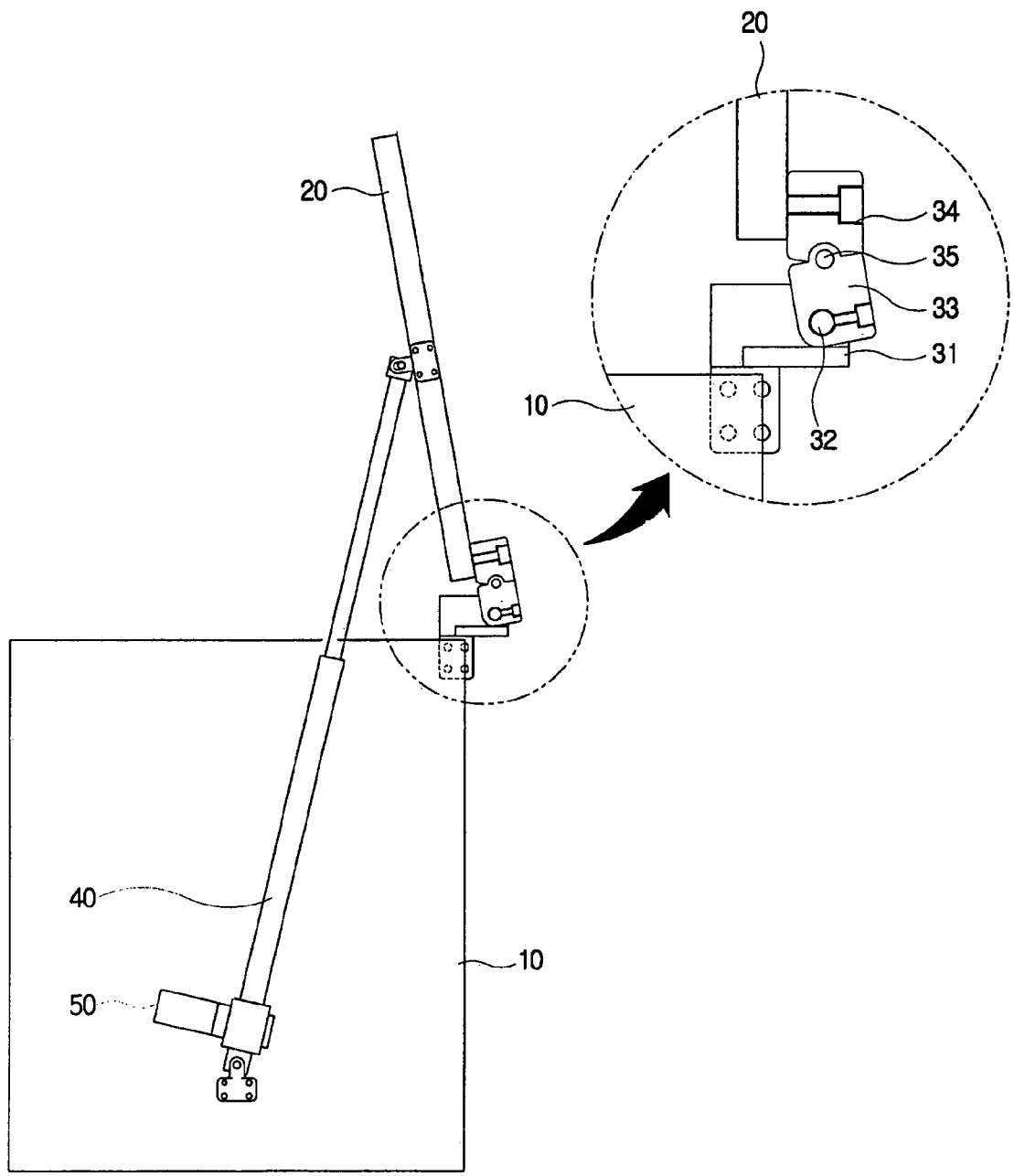
FIG. 9 schematically illustrates a lid of the reaction apparatus of FIG. 2, in an opened state.

FIG. 9 illustrates the reaction apparatus when the lid 20 is opened. As shown therein, the lifting member 40 has been lifted in the opening direction. At this time, the opposite end sides of the lifting member 40 have rotated relative to the main body 10 and the lid 20, respectively, by a predetermined amount.

In a process of opening the lid 20, when the vacuum condition is released from the reaction chamber 11 of the reaction apparatus, the lid 20 is opened at a predetermined angle by a repulsive force of the sealing member 12, provided in the opening part of the reaction chamber 11. Here, the auxiliary hinge 34 combined with the main hinge 33 rotates upward, centering on the auxiliary hinge shaft 35. The lid 20 is consequently opened, rotating upward centering on the main hinge shaft 32. Here, the main hinge 33 rotates from the hinge bracket 31 in the opening direction, thereby supporting the lid 20. Thus, the bottom part of the auxiliary hinge 34, rotating on the auxiliary hinge shaft 35, is separated from the main hinge 33 by a predetermined amount, when the lid 20 is opened.

Figure 10:
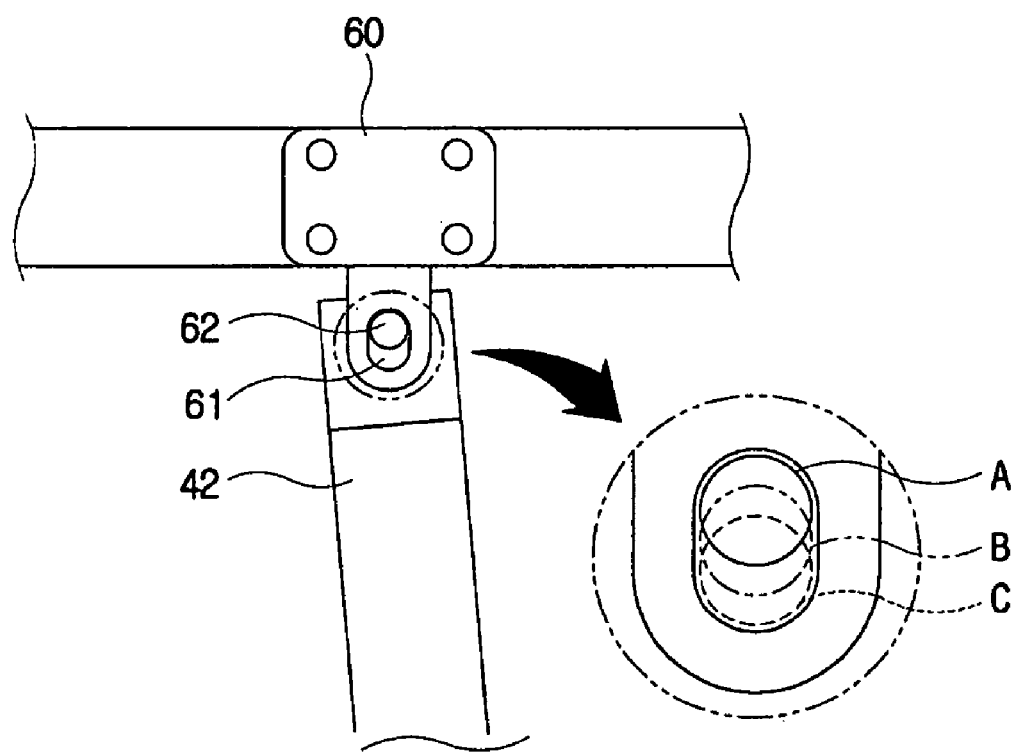
FIG. 10 is a drawing illustrating an operation of the movable hinge of FIG. 6, in the opening and closing states.

FIG. 10 illustrates locations of the movable hinge shaft 62 in the movable hinge hole 61 of the movable hinge 60, when the lid 20 is rotationally opened and closed. As shown therein, the movable hinge shaft 62 is located at an upper part ("A" position) of the movable hinge hole 61, when the lid is completely closed, in other words, after the vacuum condition is created in the reaction chamber 11. The movable hinge shaft 62 is also located at the upper part ("A" position) of the movable hinge 61 when the lid 20 is completely opened.

In a closing motion, the movable hinge shaft 62 moves to a bottom part ("C" position) of the movable hinge hole 61, causing the lifting member 40 to descend. Once the lid is closed, but prior to creating the vacuum condition in the reaction chamber 11, the movable hinge shaft 62 moves to a middle part ("B" position) of the movable hinge hole 61.

Figure 11:
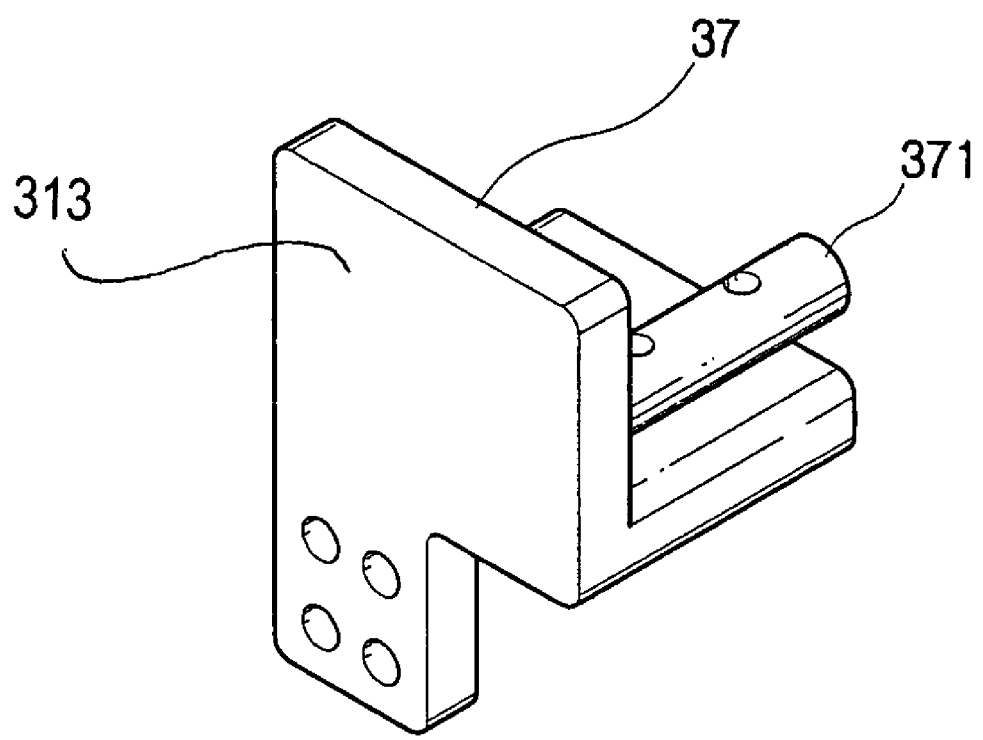
FIG. 11 is a perspective view of a hinge bracket according to a second embodiment of the present invention.

FIG. 11 illustrates the lid hinge 30 according to a second embodiment of the present invention. In the first embodiment, the main hinge shaft 32 is a separate element, provided along with the hinge bracket 31 and the main hinge 33, to rotatably combine the hinge bracket 31 and the main hinge 33. But a main hinge shaft 371 is rotatably combined to the main hinge 33, and protrudes from the supporting part 313 of a hinge bracket 37, according to the second embodiment. In the second embodiment, the lid hinge 30 can be operated without a hinge shaft individually provided with the hinge bracket 37. Instead, the main hinge shaft 371 is simply combined with the hinge bracket 37.

Figure 12:
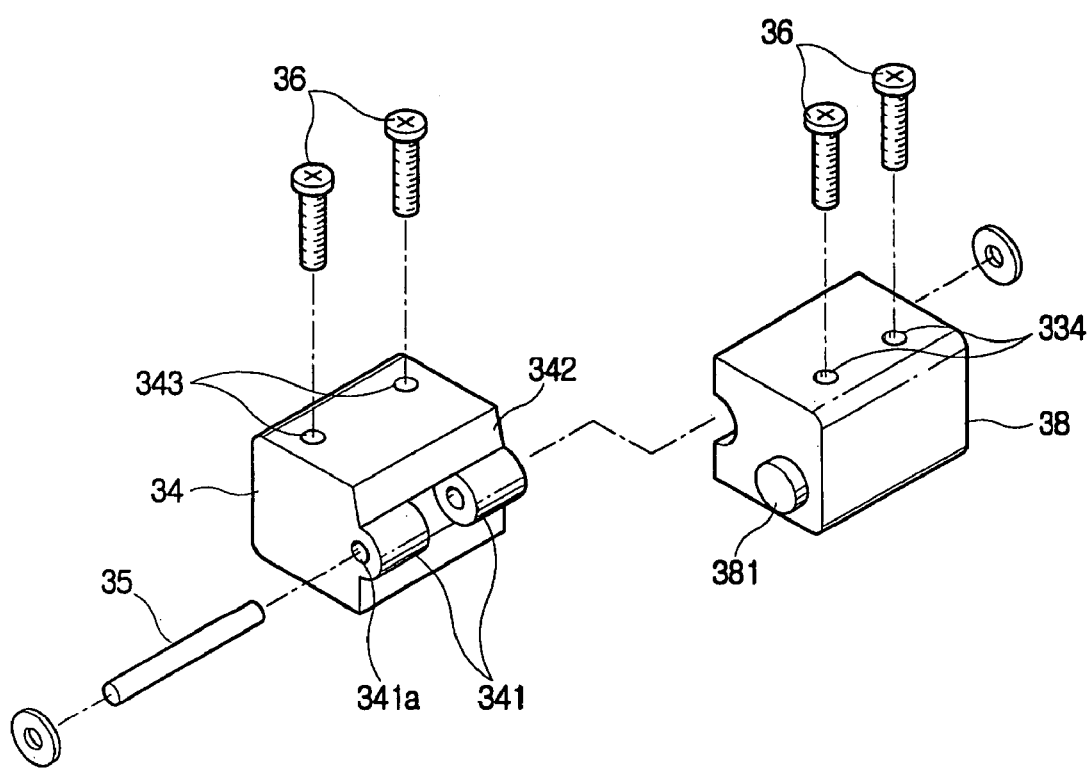
FIG. 12 is an exploded perspective view of a lid hinge according to a third embodiment of the present invention.

A main hinge shaft 381, according to a third embodiment illustrated in FIG. 12, protrudes from a side of a main hinge 38 facing the hinge bracket 31. Thus, the main hinge shaft 381 and the main hinge 38 are a single body, and are rotatably combined to the hinge bracket 31. Therefore, unlike the first embodiment, the hinge shaft does not need to be individually provided with the hinge bracket 31.

Figure 13:
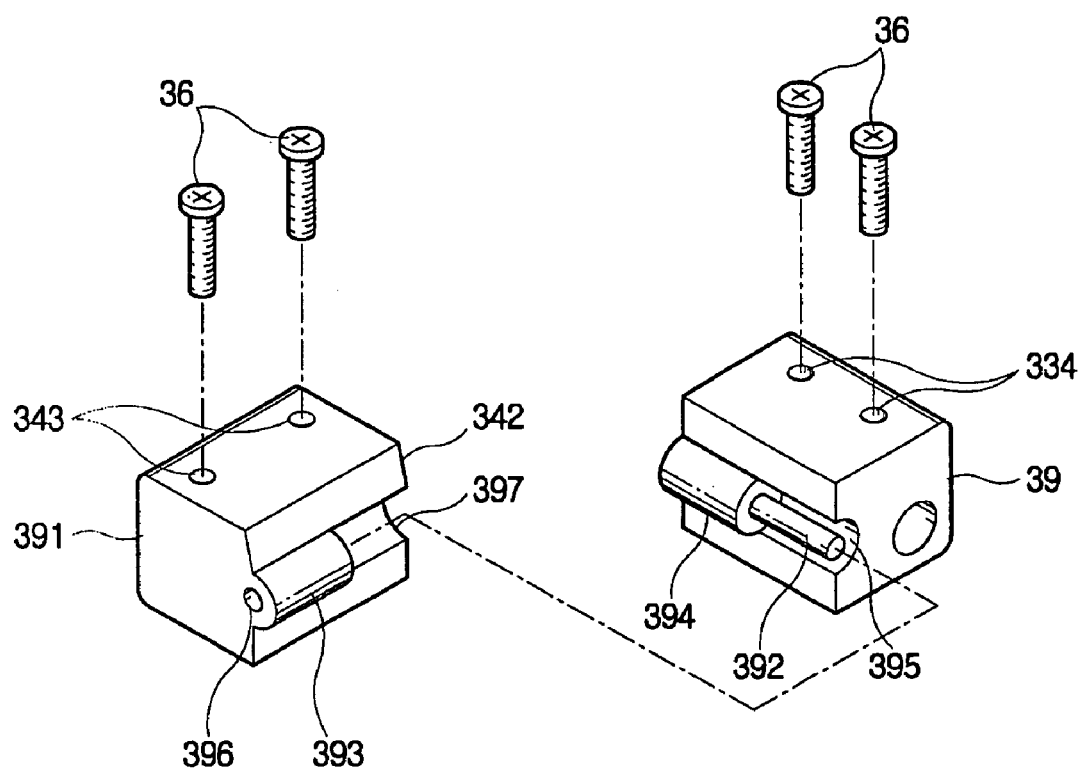
FIG. 13 is an exploded perspective view of a lid hinge according to a fourth embodiment of the present invention.

FIG. 13 illustrates a fourth embodiment of the present invention. In the fourth embodiment, an auxiliary hinge shaft 392 is provided, protruding from a first protrusion 394 of a main hinge 39, and acting as a center of rotation of an auxiliary hinge 391. A second protrusion 393 of the auxiliary hinge 391 is provided on a side facing a concave part 395 of the main hinge 39. In the second protrusion 393 of the auxiliary hinge 391, a auxiliary hinge hole 396 is provided to accommodate the auxiliary hinge shaft 392, and a concave part 397 is provided corresponding to the first protrusion 394. Thus, a hinge shaft does not need to be individually provided with the main hinge 39 and the auxiliary hinge 391.

In the above described embodiments, the driving motor is used as a source of a driving force activating the lifting member 40 to be expanded and/or contracted, but according to one aspect, hydraulic actuators are used to activate the lifting member 40. According to another aspect, pneumatic actuators are used to activate the lifting member 40.

In addition, the auxiliary hinge shaft 392 protrudes from the protrusion of the main hinge part according to the fourth embodiment, but according to another aspect, the auxiliary hinge shaft 392 protrudes from the second protrusion 393 of the auxiliary hinge 391.

Although a few embodiments of the present invention have been shown and described, it will be appreciated by those skilled in the art that changes may be made in these embodiments without departing from the principles and spirit of the invention, the scope of which is defined in the claims and their equivalents.

What is claimed is:

1. A reaction apparatus, comprising:
   a main body having
     a reaction chamber with an upper opening thereof,
     a lid hinge, and
     a lid combined to the lid hinge, rotationally opening and closing the upper opening;
   a lifting member having
     a first end separated from a rotation axis of the lid, and rotatably combined with the lid, and
     a second end rotatably combined to the main body, that moves in opening and closing directions;
     a movable hinge accommodating part combined to the lid, having a movable hinge hole, which is provided approximately parallel to the rotation axis of the lid;
     a movable hinge shaft accommodated in the movable hinge hole, rotatably combined with the first end of the lifting member; and
   a driver activating the lifting member.

2. The reaction apparatus according to claim 1, wherein: the reaction chamber creates a vacuum condition when the lid is closed.

3. The reaction apparatus according to claim 2, wherein the driver comprises:
   a driving motor;
   a location sensor limiting the movement of the lifting member; and
   a controller controlling the driving motor with a signal transmitted from the location sensor.

4. The reaction apparatus according to claim 3, wherein: the lifting member is provided in a pair at opposite sides of the main body.

5. The reaction apparatus according to claim 2, wherein: the movable hinge hole is elongated to allow the movable hinge shaft to move slidingly therein.

6. The reaction apparatus according to claim 5, wherein: the movable hinge shaft is integrally formed with the first end of the lifting member.

7. The reaction apparatus according to claim 3, further comprising:
   a movable hinge rotatably combining the lifting member to the lid, the lifting member rotating relative to the lid.

8. The reaction apparatus according to claim 1, wherein the driver comprises:
   a driving motor;
   a location sensor limiting the movement of the lifting member; and
   a controller controlling the driving motor with a signal transmitted from the location sensor.

9. The reaction apparatus according to claim 8, wherein: the lifting member is provided in a pair at opposite sides of the main body.

10. The reaction apparatus according to claim 8, further comprising:
    a movable hinge rotatably combining the lifting member to the lid, the lifting member rotating relative to the lid.

11. The reaction apparatus according to claim 1, wherein the lid hinge comprises:
    a hinge bracket combined to an end of the main body;
    a main hinge rotatably combined to the hinge bracket;
    a main hinge shaft rotatably combining the hinge bracket with the main hinge;
    an auxiliary hinge rotatably combined to the main hinge at an end part of the lid, rotatable through a predetermined range; and
    an auxiliary hinge shaft rotatably combining the main hinge with the auxiliary hinge.

12. The reaction apparatus according to claim 11, wherein:
    the main hinge is provided with a main hinge hole penetrated along a direction of a center line on which the lid rotates, and a first auxiliary hinge hole penetrated to accommodate the auxiliary hinge shaft, positioned approximately parallel to the main hinge hole.

13. The reaction apparatus according to claim 12, wherein:
    the auxiliary hinge is provided with a second hinge hole along the first hinge hole, to accommodate the auxiliary hinge shaft together with the main hinge.

14. The reaction apparatus according to claim 13, wherein:
    the auxiliary hinge and the main hinge are engaged to each other with a predetermined distance therebetween, the lid rotating within the predetermined range.

15. The reaction apparatus according to claim 12, wherein:
    the auxiliary hinge and the main hinge are engaged to each other with a predetermined distance therebetween, the lid rotating within the predetermined range.

16. The reaction apparatus according to claim 11, wherein:
    the lid hinge is plurally provided, and respectively combined to opposite sides of the end part of the main body.

17. The reaction apparatus according to claim 11, wherein:
    the main hinge shaft and the hinge bracket are integrally formed.

18. The reaction apparatus according to claim 11, wherein:
    the main hinge shaft and the main hinge are integrally formed; and
    the main hinge is combined to the hinge bracket.

19. The reaction apparatus according to claim 11, wherein:
    the auxiliary hinge shaft is integrally formed with one of the main hinge and the auxiliary hinge; and
    the auxiliary hinge shaft is rotatably combined to the remaining one of the main hinge and the auxiliary hinge.

20. The reaction apparatus according to claim 1, wherein:
the movable hinge hole is elongated to allow the movable hinge shaft to move slidingly therein.

21. The reaction apparatus according to claim 20, wherein:
the movable hinge shaft is integrally formed with the first end of the lifting member.

22. A lid rotation system for a reaction apparatus, including a main body, and a lid that opens and closes the main body, the lid rotation system comprising:
a hinge bracket connected to the main body;
a main hinge rotatably connected to the hinge bracket;
a main hinge shaft, rotatably connecting the main hinge and the hinge bracket, and about which, the lid rotates;
an auxiliary hinge, rotatably connected to the main hinge, and connected to the lid;
a lifting member, rotatably connected at a first end thereof to the lid, at a point distanced from the main hinge shaft, and rotatably connected to the main body at a second end thereof;
a movable hinge accommodating part with a movable hinge hole therein;
a movable hinge shaft, inserted into the movable hinge hole, and connected to the first end of an inner member of the lifting member; and
a driver driving the lifting member to open and close the lid.

23. The lid rotation system according to claim 22, wherein:
the main body comprises a reaction chamber with a sealing member at an opening thereof;
in a first closed position, the lid engages the sealing member, and the sealing member resists the lid; and
in a second closed position, a vacuum is created in the reaction chamber, and the resistance of the sealing member is overcome, creating an airtight seat around the opening of the reaction chamber.

24. The lid rotation system according to claim 23, wherein:
the main hinge and the auxiliary hinge are rotatably connected by an auxiliary hinge shaft, approximately parallel to the main hinge shaft; and
an inclined part is provided on one of the main hinge and the auxiliary hinge, when the lid moves from the first closed position to the second closed position, the auxiliary hinge rotating within a predetermined range about the auxiliary hinge shaft.

25. The lid rotation system according to claim 24, wherein:
when the vacuum in the reaction chamber is released, the resistance of the sealing member moves the lid from the second closed position to the first closed position, and the auxiliary hinge rotates within the predetermined range about the auxiliary hinge shaft.

26. The lid rotation system according to claim 25, wherein:
when the lid is moved from the first closed position to an opened position, the lid and the auxiliary hinge rotate about the main hinge shaft.

27. The lid rotation system according to claim 24, wherein:
the main hinge comprises a first concave part, and a first protrusion having a first auxiliary hinge hole;
the auxiliary hinge comprises a second concave part, and a second protrusion having a second auxiliary hinge hole; and
the auxiliary hinge shaft is a separate from the main hinge and the auxiliary hinge,
wherein the first concave part mates with the second protrusion, the second concave part mates with the first protrusion, and the auxiliary hinge shaft is inserted through the first and second auxiliary hinge holes.

28. The lid rotation system according to claim 24, wherein:
the main hinge comprises a first protrusion and a first concave part; and
the auxiliary hinge comprises a second protrusion and a second concave part, wherein
the first concave part mates with the second protrusion, and the second concave part mates with the first protrusion,
the auxiliary hinge shaft is integrally formed with, and protrudes from one of the first protrusion and the second protrusion, and
the remaining one of the first protrusion and the second protrusion is provided with an auxiliary hinge hole, in which the auxiliary hinge shaft is inserted.

29. The lid rotation system according to claim 24, wherein:
the main hinge shaft is rotatably connected to the hinge bracket;
the main hinge is provided with a main hinge hole, thorough which the main hinge shaft passes; and
the main hinge is connected to the main hinge shaft.

30. The lid rotation system according to claim 24, wherein:
the main hinge shaft is integrally formed with and protrudes from the hinge bracket;
the main hinge is provided with a main hinge hole, thorough which the main hinge shaft passes; and
the main hinge is rotatably connected to the main hinge shaft.

31. The lid rotation system according to claim 23, wherein the lifting member comprises:
an outer member;
an inner member, movably disposed in the outer member
a movable hinge rotatably connecting a first end of the inner member to the lid;
a combiner rotatably connecting a first end of the outer member to the main body; and
wherein the driver is connected to the outer member, and moves the inner member to open and close the lid.

32. The lid rotation system according to claim 31, wherein the driver comprises:
a driving motor; and
a motion converter, positioned on the outer member, and converting movement of the driving motor into movement of the inner member.

33. The lid rotation system according to claim 32, wherein the motion converter comprises:
a bevel gear train.

34. The lid rotation system according to claim 32, wherein the motion converter comprises:
a worm gear train.

35. The lid rotation system according to claim 32, wherein the driver further comprises:
at least one location sensor; and
a controller, controlling the driving motor using information regarding a position of the inner member received from the at least one location sensor.

36. The lid rotation system according to claim 31, wherein the movable hinge hole is approximately parallel to the main hinge shaft.

37. The lid rotation system according to claim 36, wherein:
the movable hinge shaft and the inner member are integrally formed.

38. The lid rotation system according to claim 36, wherein:
the movable hinge hole is elongated, the movable hinge shaft being movable within the movable hinge hole.

39. The lid rotation system according to claim 38, wherein:
the movable hinge is located at a first end position of the movable hinge hole when the lid is completely open, and when the lid is in the second closed position;
the movable hinge is located at a second end position of the movable hinge hole when the lid is closing; and
the movable hinge is located at an intermediate position of the movable hinge hole when the lid is in the first closed position.

40. The lid rotation system according to claim 22, wherein the reaction apparatus further comprises:
an additional lifting member provided on a side of the main body opposite the lifting member.

41. A reaction apparatus, comprising:
a main body with a reaction chamber, and a sealing member disposed at an opening of the reaction chamber;
a lid, rotationally opening and closing the reaction chamber;
a lid rotation system that positions the lid approximately parallel to the sealing member, to ease creation of a vacuum in the reaction chamber;
a hinge bracket connected to the main body;
a main hinge rotatably connected to the hinge bracket;
a main hinge shaft, rotatably connecting the main hinge and the hinge bracket, and about which, the lid rotates;
an auxiliary hinge, rotatably connected to the main hinge, and connected to the lid;
a lifting member, rotatably connected at a first end thereof to the lid, at a point distanced from the main hinge shaft, and rotatably connected to the main body at a second end thereof;
a movable hinge accommodating part with a movable hinge hole therein;
a movable hinge shaft, inserted into the movable hinge hole, and connected to the first end of an inner member; and
a driver, driving the lid rotation system to automatically open and close the lid, and maintain closure of the lid during creation of a vacuum in the reaction chamber.

* * * * *

UNITED STATES PATENT AND TRADEMARK OFFICE
CERTIFICATE OF CORRECTION

| | |
|---|---|
| PATENT NO. | : 7,101,442 B2 |
| APPLICATION NO. | : 10/802926 |
| DATED | : September 5, 2006 |
| INVENTOR(S) | : Jin-hyuk Choi et al. |

It is certified that error appears in the above-identified patent and that said Letters Patent is hereby corrected as shown below:

Column 9, Line 36, change "seat" to --seal--.

Column 10, Line 27, change "thorough" to --through--.

Column 10, Line 34, change "thorough" to --through--.

Signed and Sealed this

Sixth Day of February, 2007

JON W. DUDAS
*Director of the United States Patent and Trademark Office*